United States Patent [19]
Ota

[11] Patent Number: 5,166,700
[45] Date of Patent: Nov. 24, 1992

[54] THERMAL PRINT HEAD
[75] Inventor: Shigeo Ota, Kyoto, Japan
[73] Assignee: Rohm Co., Ltd., Kyoto, Japan
[21] Appl. No.: 814,451
[22] Filed: Dec. 30, 1991
[30] Foreign Application Priority Data
  Jan. 23, 1991 [JP] Japan .................. 3-056210
[51] Int. Cl.[5] ............................. B41J 2/335
[52] U.S. Cl. ............................. 346/76 PH
[58] Field of Search .................... 346/76 PH
[56] References Cited
  U.S. PATENT DOCUMENTS
  3,597,839 8/1971 Jaccodine .
  4,963,886 10/1990 Fukuda et al. ............ 346/76 PH
  FOREIGN PATENT DOCUMENTS
  0079063 5/1983 European Pat. Off. .
  2952161 6/1981 Fed. Rep. of Germany .
  59-78867 5/1984 Japan .
  3-34452 2/1991 Japan .
  1369689 10/1974 United Kingdom .

Primary Examiner—Benjamin R. Fuller
Assistant Examiner—Huan Tran
Attorney, Agent, or Firm—William H. Eilberg

[57] ABSTRACT

A thermal print head comprises a head circuit board which is made of an insulating material, the heat circuit board carrying a heating resistor, a plurality of drive elements for heating the resistor, a plurality of connection terminals, and a wiring conductor pattern connecting the connection terminals to the drive elements. The wiring conductor pattern comprises a plurality of separate printed wirings, at least one of the wirings having at least one pair of separated ends which are connected by a raised wire, at least one of the other wirings being made to extend between the pair of separated ends.

7 Claims, 4 Drawing Sheets

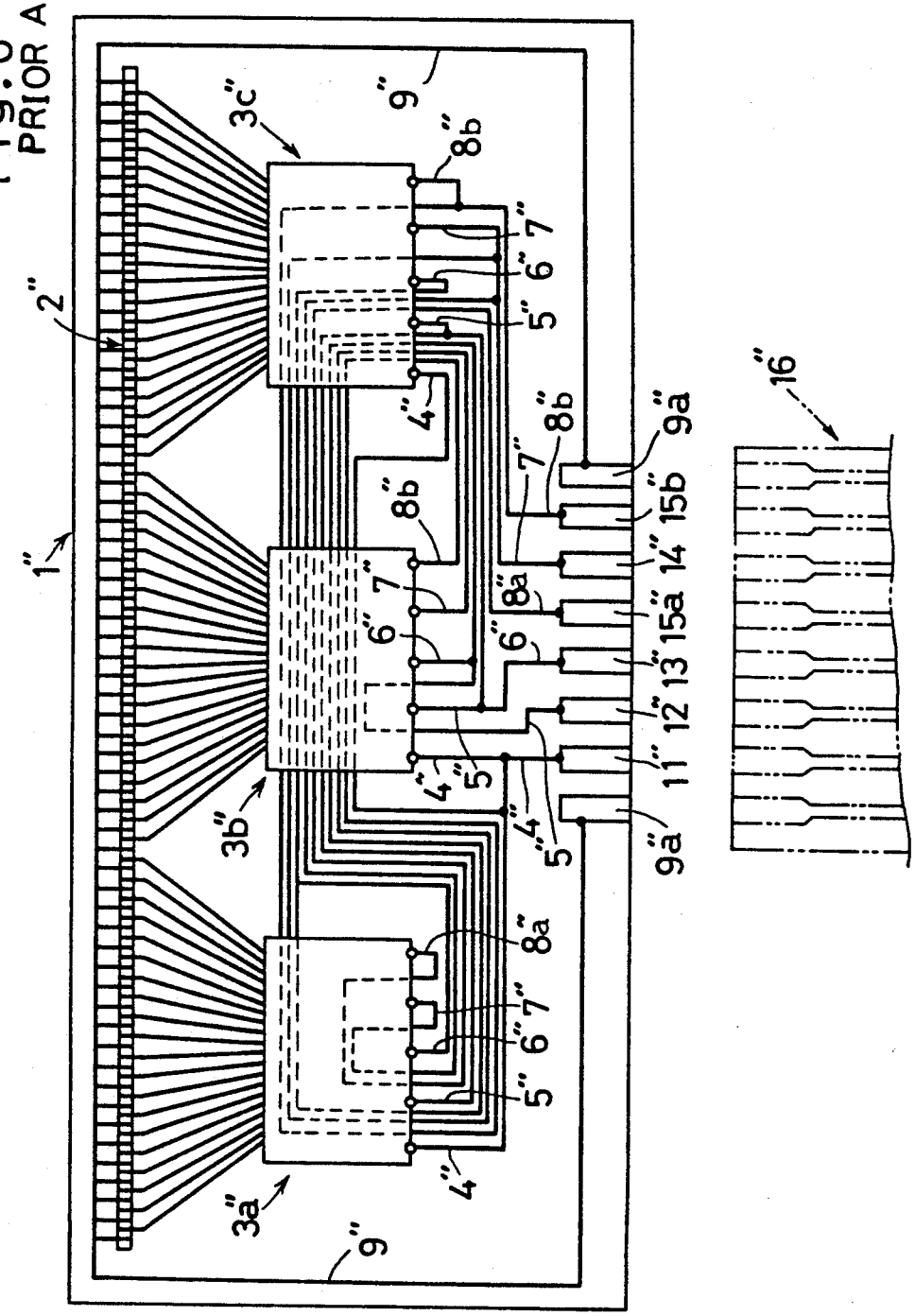

THERMAL PRINT HEAD

BACKGROUND OF THE INVENTION

1. Field of the Invention

This invention relates generally to thermal print heads which are widely used in facsimile machines, word processors and so forth. More specifically, the invention relates to a thermal print head of the type which comprises a head circuit board carrying a resistor line divisionally actuated by an array of drive IC's.

2. Description of the Prior Art

In general, a line-type thermal print head comprises an elongate head circuit board which carries a heating resistor line extending along one longitudinal edge of the circuit board. The circuit board also carries an array of drive IC's for divisionally actuating the resistor line to provide a line of multiple heating dots, and a printed conductor pattern including connection terminals disposed in a comb-like arrangement adjacent to the other longitudinal edge of the circuit board. The connection terminals are used to establish electrical connection to external circuitry.

In such a thermal print head, it is known advantageous to reduce the total number of connection terminals and to arrange them locally within a limited region which is substantially shorter than the head circuit board. The advantages of such an arrangement are fully described in U.S. Pat. No. 4,963,886 (Patented: Oct. 16, 1990).

Specifically, the above U.S. patent teaches that at least selected connection terminals are used commonly for at least selected drive IC's by utilizing printed wiring conductors, thereby reducing the required number of connection terminals. While this U.S. patent does not disclose a specific arrangement for the wiring conductors, it is conceivable to arrange the wiring conductors in such a manner as shown in FIG. 5 or 6 of the accompanying drawings.

In FIG. 5, a head circuit board 1' is shown to carry a heating resistor line 2' extending along one longitudinal edge of the circuit board, and an array of drive IC's $3a'$-$3c'$ for divisionally actuating the resistor line 2'. The circuit board is further formed with a printed conductor pattern which includes a wiring conductor pattern 4'-$8b'$, a common electrode 9', and connection terminals 11'-$15b'$.

The wiring conductor pattern includes eight separate printed wirings 4'-$8b'$ for the respective drive IC's $3a'$-$3c'$. Specifically, the printed wirings consists of a power supply wiring 4' common for the respective drive IC's $3a'$-$3c'$, a clock signal wiring 5' also common for the respective drive IC's $3a'$-$3c'$, a latch signal wiring $6a'$ only for the central drive IC $3b'$, an additional latch signal wiring $6b'$ common only for the two drive IC's $3a'$, $3c'$, two kinds of enabling signal wirings $7a'$, $8a'$ only for the central drive IC $3b'$, and two additional kinds of inabling signal wirings $7b'$, $8b'$, common only for the two drive IC's $3a'$, $3c'$. The respective wirings 4'-$8b'$ are made to extend partially under the drive IC's $3b'$, $3c'$.

The connection terminals 11', 12', $13a'$, $13b'$, $14a'$, $14b'$, $15a'$, $15b'$ are connected to the respective wirings 4'-$8b'$ and arranged centrally at suitable spacing adjacent to another longitudinal edge of the head circuit board 1' which is located opposite to the resistor line 2'. Thus, the number of these connection terminals 11'-$15b'$ is the same as that of the respective wirings 4'-$8b'$.

The common electrode 9' is made to extend along the four edges of the head circuit board 1'. The common electrode itself has a pair of connection terminals $9a'$ which are arranged in side-by-side relation to the other connection terminals 11'-$15b'$ to provide a total of ten connection terminals.

The connection terminals $9a'$ and 11'-$15b'$ are used for connection to external circuitry through a flexible cable 16' which has a wiring conductor pattern $16a'$ in corresponding relation to the connection terminals.

According to the arrangement shown in FIG. 5, only the two wirings 4', 5' and their counterpart connection terminals 11', 12' are used commonly for all the drive IC's $3a'$-$3c'$. This limitation comes mainly from the fact that the respective wirings 4'-$15b'$ cannot cross each other in a same plane without electrically connecting to each other.

Thus, the arrangement of FIG. 5 cannot realize a drastic reduction in the total number of connection terminals, consequently failing to fully provide the intended advantages described in U.S. Pat. No. 4,963,886. Particularly, when the drive IC's $3a'$-$3c'$ are provided in a larger number than illustrated in FIG. 5, the total number of connection terminals will also increase correspondingly, which necessitates enlargement in the width W' of the flexible cable 16. As a result, the overall size, weight and cost of the thermal head will inevitably increase.

FIG. 6 shows another possible arrangement for a head circuit board 1". In FIG. 6, all elements are represented by reference numerals similar to those used in FIG. 5 but each accompanied by a double prime ("). Thus, the elements which are identical to those already described in connection with FIG. 5 are not described here to avoid substantial duplication.

According to the arrangement of FIG. 6, a total of eight connection terminals $9a''$, 11", 12", 13", 14", $15a''$, $15b''$ are provided. Of these connection terminals, the four terminals 11"-14" are connected commonly to all the drive IC's $3a''$-$3c''$ through four printed wirings 4"-7" which are made to extend along respective complicated paths without crossing each other. On the other hand, the terminal $15a''$ is connected only to the single drive IC $3a''$ through a printed wiring $8a''$, whereas the terminal $15b''$ is commonly connected only to the two drive IC's $3b''$, $3c''$ through a printed wiring $8b''$. Both of complicated paths.

Obviously, the arrangement of FIG. 6 is advantageous over that of FIG. 5 in that the total number of connection terminals $9a''$, 11"-$15b''$ is additionally reduced together with the width of the flexible cable 16" which is connected to the connection terminals. However, realization of this arrangement requires that the respective wirings 4"-$8b''$ are made to extend along the complicated and long paths in extremely crowded condition, so that the wiring patterning (etching) is impractically difficult and costly. Such a problem becomes more serious when the total number of drive IC's increases to necessitate further complication of the wiring pattern.

Though not illustrated, it is also conceivable to use a multi-layer head circuit board wherein various wirings in different layers are made to cross each other three-dimensionally without electrical connection therebetween. However, such a solution is even more costly than the arrangement of FIG. 6 due to the adoption of the multi-layer head circuit board which requires repetitive formation of different layers and repetitive etching on the different layers.

SUMMARY OF THE INVENTION

It is, therefore, an object of the invention to provide a thermal print head wherein the total number of connection terminals can be drastically reduced without using a multi-layer head circuit board.

According to the invention, there is provided a thermal print head comprising a head circuit board which is made of an insulating material, the head circuit board having a surface carrying a heating resistor means, a plurality of drive elements for heating the resistor means, a plurality of connection terminals, and a wiring conductor pattern connecting the connection terminals to the drive elements, wherein the wiring conductor pattern comprises a plurality of printed wirings, at least one of the printed wirings having at least one pair of separated ends which are connected by a raised wire, at least one of the other printed wirings being made to extend between said pair of separated ends.

Other objects, features and advantages of the present invention will be fully understood from the following detailed description given with reference to the accompanying drawings.

BRIEF DESCRIPTION OF THE DRAWINGS

In the accompanying drawings:

FIG. 6 is also a plan view showing another prior art thermal print head.

DETAILED DESCRIPTION

Figure 1:
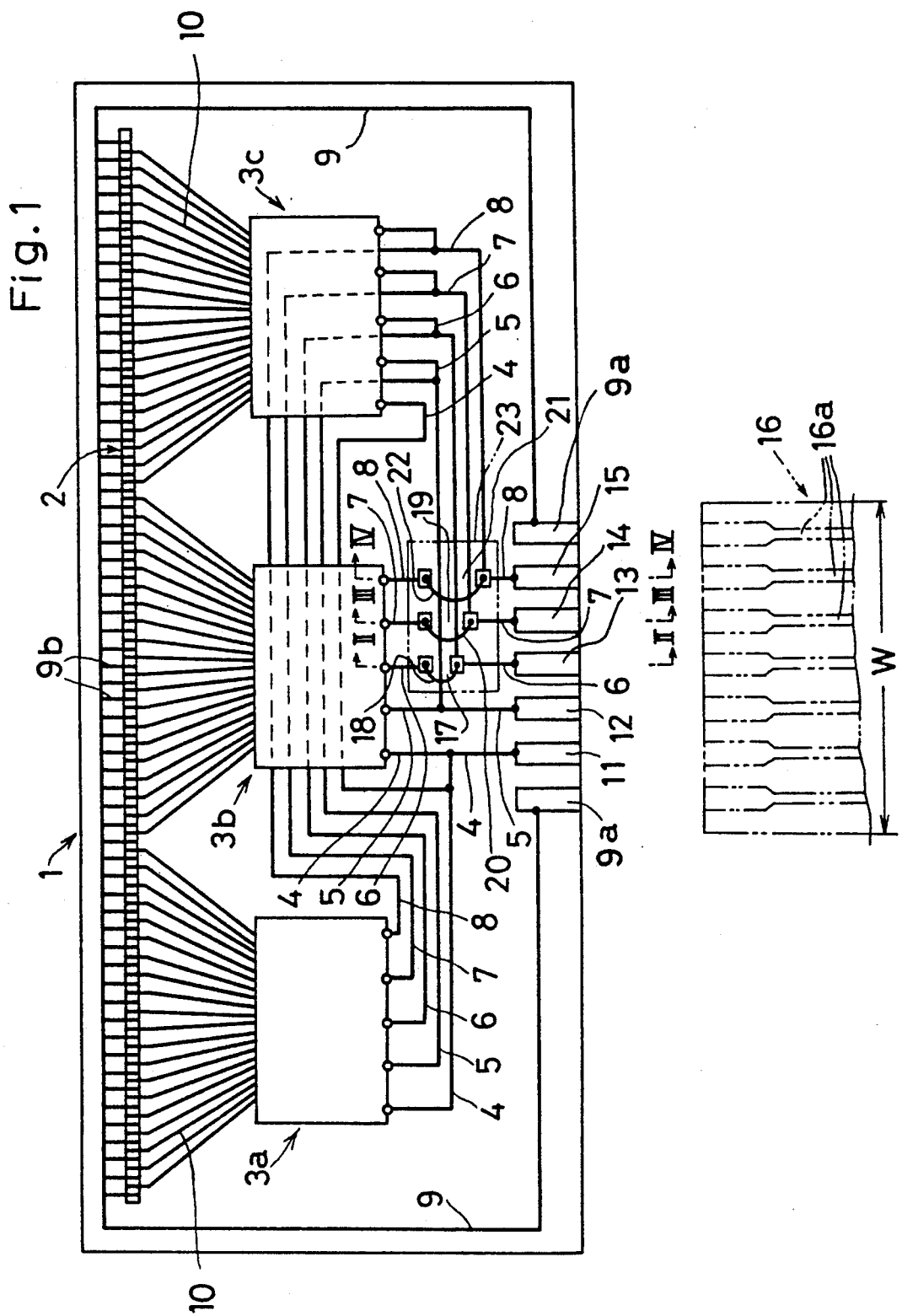
FIG. 1 is a plan view showing a thermal head according to an embodiment of the present invention.

Referring now to FIG. 1 of the accompanying drawings, there is illustrated an elongate head circuit board 1 which is incorporated in a thermal print head according to an embodiment of the present invention. The head circuit board 1 is made of an insulating material such as ceramic.

The head circuit board 1 has a surface which carries a heating resistor line 2 extending along one longitudinal edge of the board. The surface of the head circuit board also carries an array of drive IC's 3a-3c for divisionally actuating the resistor line 2, thereby providing a line of heating dots. The surface of the head circuit board further carries a printed conductor pattern which includes a wiring conductor pattern 4-8, a common electrode 9, individual electrodes 10, and connection terminals 11-15.

According to the illustrated embodiment, the wiring conductor pattern includes five separate printed wirings 4-8 each used commonly for the respective drive IC's 3a-3c. Specifically, the separate printed wirings consist, for example, of a power supply wiring 4, a clock signal wiring 5, a latch signal wiring 6, and two kinds of enabling signal wirings 7, 8. According to the illustrated embodiment, the respective wirings 4-8 are made to extend partially under the drive IC's 3b, 3c by intervention of an insulating layer (not shown).

The connection terminals 11-15 are arranged centrally at suitable spacing adjacent to another longitudinal edge of the head circuit board 1 which is located opposite to the resistor line 2. The connection terminals 11-15 are connected to the respective wirings 4-8.

The common electrode 9 is made to extend along the four edges of the head circuit board 1, as shown in FIG. 1. The common electrode itself has a pair of connection terminals 9a which are arranged in side-by-side relation to the other connection terminals 11-15. Further, the common electrode also has comb-like teeth 9b connected to the resistor line 2.

The individual electrodes 10 extend from the respective drive IC's 3a-3c and are connected to the resistor line 2 between the respective comb-like teeth 9b of the common electrode 9. Thus, different spots or dots of the resistor line 2 can be heated by passing electric current through selected ones of the individual electrodes 10.

The connection terminals 9a and 11-15 may be connected to external circuitry through a flexible cable 16 (or a flexible connector board) which is formed with a wiring pattern 16a in corresponding relation to the connection terminals of the head circuit board 1. The width W of the flexible cable 16 can be rendered correspondingly small if the connection terminals of the head circuit board are reduced in number and arranged within a limited small region of the head circuit board, as disclosed in U.S. Pat. No. 4,963,886.

Figure 2:
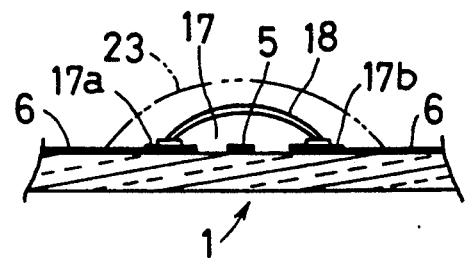
FIG. 2 is an enlarged sectional view taken along lines II—II in FIG. 1.

According to the illustrated embodiment of the present invention, the latch signal wiring 6 is interrupted at 17 to have a first pair of separated ends 17a, 17b which are spaced from each other, as shown in FIG. 2. The clock signal wiring 5 is made to extend between the first pair of separated ends 17a, 17b, and a raised wire 18 is made to connect between the first pair of separated ends 17a, 17b while electrically circumventing the clock signal wiring 5.

Figure 3:
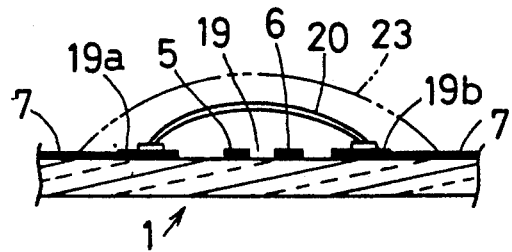
FIG. 3 is an enlarged sectional view taken along lines III—III in FIG. 1.

Similarly, one enabling signal wiring 7 is interrupted at 19 to have a second pair of separated ends 19a, 19b whose spacing is larger than that of the first pair of separated ends 17a, 17b, as shown in FIG. 3. The clock signal wiring 5 and the latch signal wiring 6 are made to extend between the second pair of separated ends 19a, 19b, and another raised wire 20 is made to connect between the second pair of separated ends 19a, 19b while electrically circumventing the wirings 5, 6.

Figure 4:
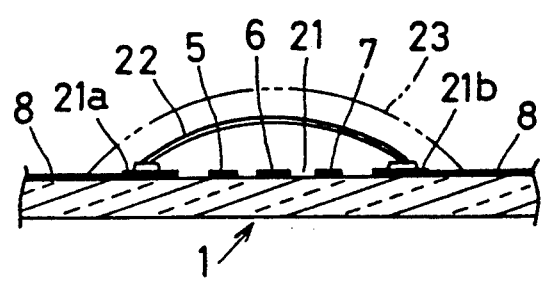
FIG. 4 is an enlarged sectional view taken along lines IV—IV in FIG. 1.
Figure 5:
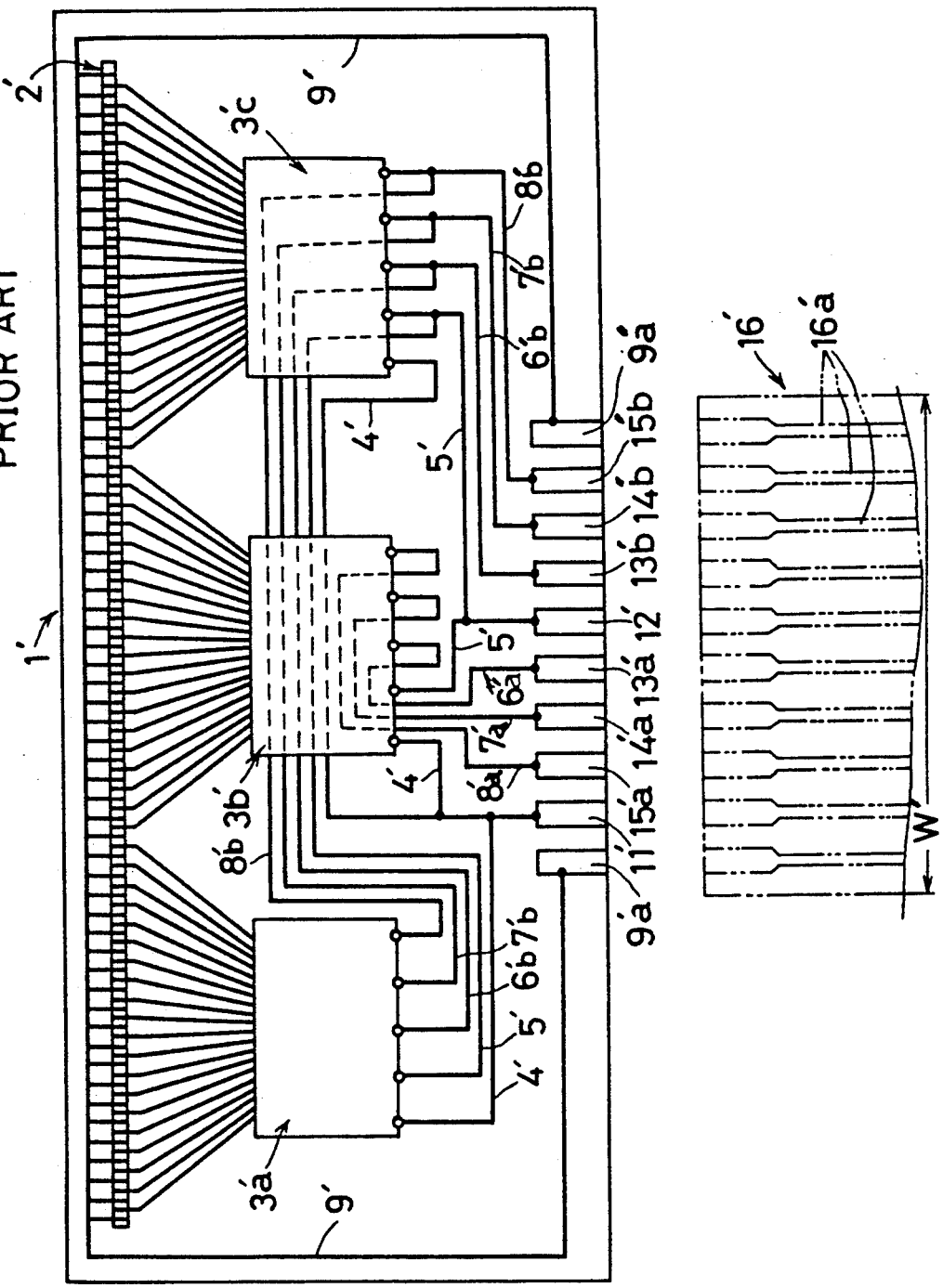
FIG. 5 is a plan view showing a prior art thermal print head.

Further, the other enabling signal wiring 8 is interrupted at 21 to have a third pair of separated ends 21a, 21b whose spacing is larger than those of the first and second pairs of separated ends 17a, 17b and 19a, 19b, as shown in FIG. 4. The wirings 5-7 are made to extend between the third pair of separated ends 21a, 21b, and a further raised wire 22 is made to connect between the third pair of separated ends 21a, 21b while electrically circumventing the wirings 5-7.

Each of the raised wires 18, 20, 22 may be made of gold for example and bonded by using a known wire bonding apparatus (not shown). Preferably, the raised wire should be enclosed in a package 23 which is made of a heat-resistant synthetic resin, thereby protecting the raised wire while improving mechanical stability at the interrupted portion 17, 19, 21.

According to the present invention, although the respective wirings 4-8 are formed in a single layer, they can cross each other without electrical connection therebetween. Thus, each of the respective wirings 4-8 can be used commonly for all of the drive IC's 3a–3c, and the required number of connection terminals 11–15 can be correspondingly reduced (i.e., one connection terminal for a corresponding connection point of each drive IC).

Obviously, the arrangement according to the present invention is much more advantageous than forming a plurality of insulating layers each carrying a wiring or wirings crossing the wiring(s) of the other layer(s). Indeed, the formation of plural insulating layers requires repetitive formation of the layers and repetitive conductor etching on the respective layers, consequently resulting in great cost increase. On the other hand, the present invention requires only a single etching operation, and the raised wires 18, 20, 22 may be bonded easily by using a known wire-bonding method.

Further, due to the reduction in the total number of connection terminals 9a, 11–15, the width W of the flexible cable 16 (or flexible connector board) can be also reduced correspondingly, and the wiring pattern 16a on the flexible cable can be simplified. Thus, the overall cost of the thermal print head is additionally reduced.

According to the illustrated embodiment, the interrupted portions 17, 19, 21 are disposed side by side adjacent to each other. Such an arrangement is desirable for successively performing subsequent bonding of the raised wires 18, 20, 22 and subsequent formation of the resinous packages 23 within a short time.

The invention being thus described, it is obvious that the same may be varied in many ways. For instance, the power supply wiring 4 and clock signal wiring 5, which are not interrupted according to the illustrated embodiment, may be similarly interrupted to enable a more complicated wiring pattern, thereby allowing a larger number of drive IC's (as required to elongate the length of the resistor line 2) to be incorporated in the thermal print head. Further, each of the wirings 4–8 may be formed with two or more interrupted portions. Such variations are not to be regarded as a departure from the spirit and scope of the invention, and all such modifications as would be obvious to those skilled in the art are intended to be included within the scope of the following claims.

I claim:

1. A thermal print head comprising a head circuit board which is made of an insulating material, the head circuit board having a surface carrying a heating resistor means, a plurality of drive elements for heating the resistor means, a plurality of connection terminals, and a wiring conductor pattern connecting the connection terminals to the drive elements, wherein
    the wiring conductor pattern comprises a plurality of printed wirings, at least one of the printed wirings having at least one pair of separated ends which are connected by a raised wire, at least one of the other printed wirings being made to extend between said pair of separated ends in crossing relation to the raised wire and without electrical connection therewith.

2. The thermal print head according to claim 1, wherein the raised wire is enclosed in a package of heat-resistant resin.

3. The thermal print head according to claim 1, wherein plural ones of the printed wirings have respective pairs of separated ends which are connected by respective raised wires.

4. The thermal print head according to claim 3, wherein the respective pairs of separated ends are arranged adjacent to each other.

5. The thermal print head according to claim 4, wherein the respective pairs of separated ends are arranged side by side.

6. The thermal print head according to claim 3, wherein each of the raised wires is enclosed in a package of heat-resistant resin.

7. The thermal print head according to claim 3, wherein the respective pairs of separated ends are differently spaced, and different numbers of said other printed wirings are made to extend between the respective pairs of separated ends.

* * * * *